United States Patent [19]
van der Pool et al.

[11] 4,129,823
[45] Dec. 12, 1978

[54] SYSTEM FOR DETERMINING THE CURRENT-VOLTAGE CHARACTERISTICS OF A PHOTOVOLTAIC ARRAY

[75] Inventors: Kees van der Pool, Canyon Country; Louis S. Rosinski, Jr., Canoga Park; Johann B. Belli, Sylmar, all of Calif.

[73] Assignee: Sensor Technology, Inc., Chatsworth, Calif.

[21] Appl. No.: 848,081

[22] Filed: Nov. 3, 1977

[51] Int. Cl.² .......................................... G01R 31/024
[52] U.S. Cl. ..................................... 324/20 R; 324/22
[58] Field of Search .................... 324/20 R, 22, 24, 25, 324/158 R, 158 D; 315/149; 356/229

[56] References Cited
U.S. PATENT DOCUMENTS

| | | | |
|---|---|---|---|
| 3,809,951 | 5/1974 | Vital | 315/149 |
| 3,950,640 | 4/1976 | Webb et al. | 315/149 |

*Primary Examiner*—M. Tokar
*Attorney, Agent, or Firm*—Fulwider, Patton, Rieber, Lee & Utecht

[57] ABSTRACT

A nonlinear load circuit, consisting of a transistor and a resistor in series, is provided for the photovoltaic array under test. Base bias for the transistor is supplied via the source-to-drain path of a field effect transistor (FET). A ramp signal is fed to the gate of the FET. As a result of the nonlinear relationship between the gate voltage and source-to-drain current of the FET, equal ramp steps result in a nonlinear effective load for the array under test. This produces a very gradual change in load impedance for each ramp step in the regions of high current output from the array ("current mode"), and relatively greater changes in load impedance for each ramp step at output levels of lower current and higher voltage from the array ("voltage mode").

Advantageously, the array is illuminated by a pulsed flash lamp. A photosensor detects the light level incident on the array, and comparison circuitry provides a "sample" pulse each time that the incident light level is at a selected value. This "sample" pulse gates a pair of sample and hold circuits that respectively sample the array output current and voltage under the load condition determined by the present ramp step. Consecutive like operations facilitate measurement and plotting of the complete current-voltage curve.

9 Claims, 2 Drawing Figures

SYSTEM FOR DETERMINING THE CURRENT-VOLTAGE CHARACTERISTICS OF A PHOTOVOLTAIC ARRAY

BACKGROUND OF THE INVENTION

1. Field of the Invention

The present invention relates to a system for determining the current-voltage characteristics of photovoltaic array, and particularly for such a system that facilitates the automatic plotting of the current-voltage characteristic curve of such an array at a selectable illumination level.

2. Description of the Prior Art

In the manufacture and testing of silicon photovoltaic arrays such as solar panels and solar power modules, it is desirable to measure and plot the current-voltage characteristics of each array. Several problems are encountered when this is done automatically.

First, it is important to provide uniform illumination over the entire solar module surface. This requires the use of a high intensity light source placed at a sufficient distance from the device under test so that the illuminating rays are parallel over the entire array surface. This is best accomplished using a high power xenon or like flash tube. Typically such flash tube is excited by an R-C circuit so as to produce repetitive flashes at a fixed duty cycle, usually synchronous with the 60 Hz power line frequency. By placing such a flash tube at say 7 feet from the device under test, substantially parallel light beam illumination is obtained over the entire array surface of a typical array which may be from two feet square to about five feet square.

With such an arrangement, a typical peak light output value at the surface of the photovoltaic array may be on the order of 125 mW/cm$^2$. However, since the illumination is provided from a flash tube, the actual light occurs as a series of flashes during each of which the light level rises from zero to the peak value and then falls back to zero. If the output characteristics of the photovoltaic array are to be measured at a known light intensity level, provision must be made to take the measurement only when the incident light level is at the desired value. One object of the present invention is to provide such a system wherein, while using a flash tube illumination source, the array output characteristics can be measured automatically at any desired illumination level up to the peak output value of the flash lamp source.

A second problem arises from the current-voltage characteristics themselves. This can be understood in conjunction with FIG. 2 which shows a plot of the output current as a function of output voltage from a typical photovoltaic array.

Under approximately short-circuit or very low resistance load conditions, the array provides a relatively high current output. With a very slight change in load resistance, the array output voltage may change rapidly from about 2 volts to about 20 volts with a minimal change in current. In this "current mode" region, accurate measurement requires changing the value of the low resistance load in very small increments. If this is not done, the measurement points will change abruptly from say 2 volts to say 20 volts, with few, or possibly no measurements obtained at intermediate voltage levels. With such an arrangement, an associated X-Y plotter will jump directly from a starting position of low voltage to a second position of high voltage, without accurate plotting of the intermediate points. In other words, the plotter would only indicate the points at the beginning and end of the current mode region of the output characteristic curve. Inaccuracy would result.

As the load resistance increases, the photovoltaic array output exhibits a "voltage mode". As can be seen in FIG. 2, in this mode the current changes significantly with relatively smaller change in output voltage. For accurate plotting of this portion of the curve, it is desirable to take consecutive measurements with relatively larger incremental changes in the load impedance.

Another object of the present invention is to provide a system for changing the load impedance across the photovoltaic array under test in a nonlinear fashion, so that in the current mode the load resistance is changed in small increments, and under voltage mode conditions the load resistance is changed in larger increments.

Other objects of the present invention are to provide a system for determining the current-voltage characteristics of a photovoltaic array wherein:

1. The illumination level at which the measurements are taken is selectable;
2. Each measurement is taken when the instantaneous illumination level is at the desired value, by using appropriate sample and hold circuits;
3. Nonlinear load circuitry is employed which uses the transfer characteristics of a field effect transistor (FET) to provide the necessary nonlinear load characteristics for the array under test;
4. Ramp generator circuitry is used in conjunction with the nonlinear load circuit to achieve consecutive load conditions that will result in measurement on the entire current-voltage characteristic curve of the array under test, thereby facilitating;
5. The use of a conventional X-Y plotter automatically to produce an output characteristic curve for the device.

SUMMARY OF THE INVENTION

These and other objectives are achieved by providing a system wherein the current-voltage characteristics of a photovoltaic array are measured automatically under load conditions that change in nonlinear fashion which compensates for the differences in characteristics of the array output in the current and voltage modes.

The photovoltaic array under test is connected to a nonlinear load circuit which advantageously employs nonlinear characteristics of a field effect transistor so as to change the array load impedance in very fine steps at the low resistance region, and in larger steps in the higher impedance range. A clock-driven ramp generator provides a ramp signal that is used to control the nonlinear load. Consecutive ramp steps of equal incremental voltage result in the desired nonlinear incremental change in array load resistance.

To facilitate array measurement at a selected light level, the pulsed light output from a flash lamp source is detected by a photosensor situated adjacent to the array under test. When the illumination reaches the desired level, a "sample" signal is generated which gates a pair of sample and hold circuits that respectively sample the current and voltage from the photovoltaic array under the present load conditions. These values are held until the next measurement, which occurs on the next lamp flash. Meanwhile, the sampled voltage and current levels may be plotted on an X-Y plotter.

BRIEF DESCRIPTION OF THE DRAWINGS

A detailed description of the invention will be made with reference to the accompanying drawings wherein like numerals designate corresponding elements in the several figures.

DESCRIPTION OF THE PREFERRED EMBODIMENT

The following description is of the best presently contemplated mode of carrying out the invention. This description is not to be taken in a limiting sense, but is made merely for the purpose of illustrating the general principles of the invention since the scope of the invention best is defined by the appended claims.

Figure 1:
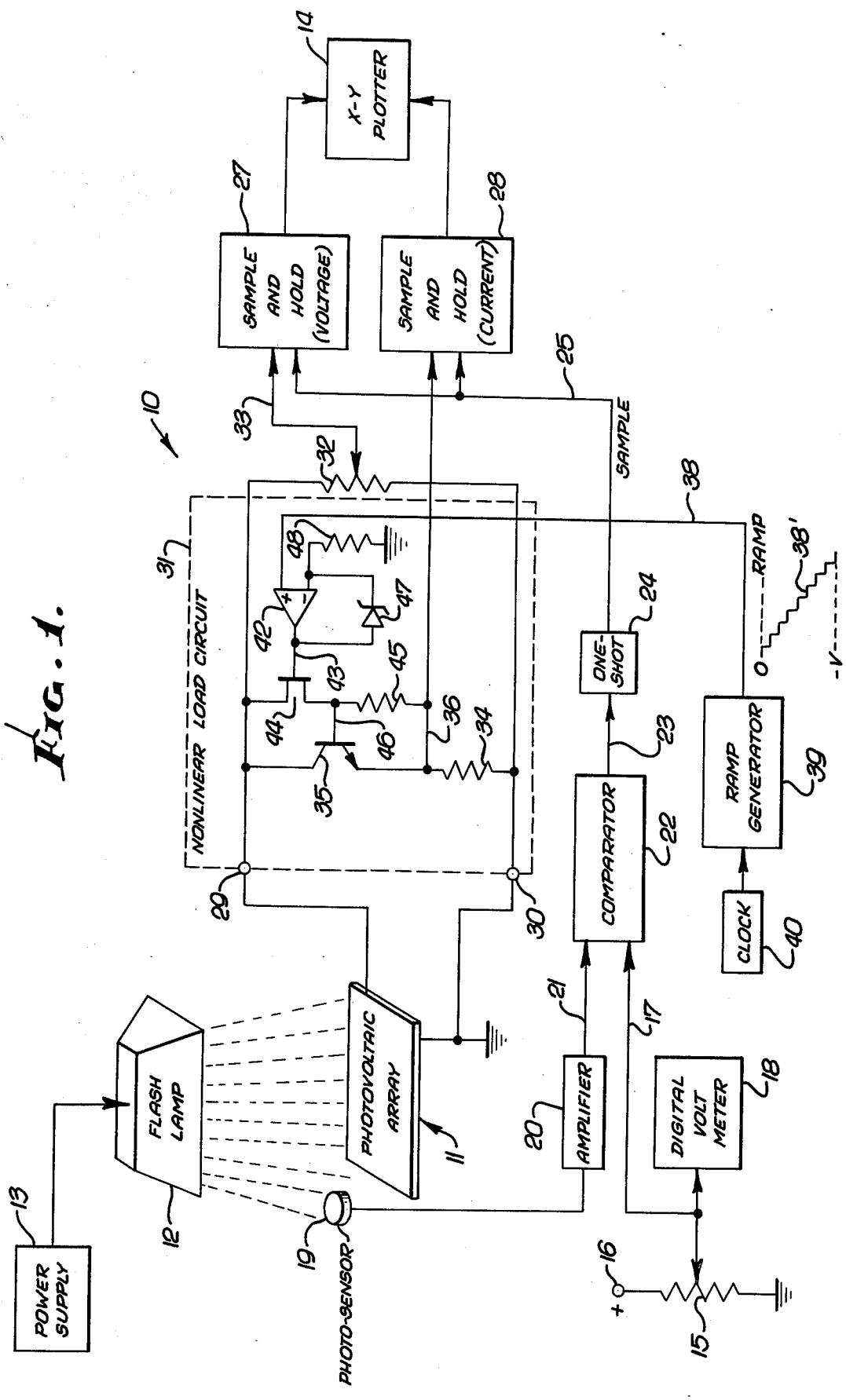
FIG. 1 is an electrical diagram of a system for determining the current-voltage characteristics of a photovoltaic array, in accordance with the present invention.

Referring to FIG. 1, the inventive system 10 is used to determine the current-voltage characteristics of a photovoltaic array 11 under test. The array 11 is substantially uniformly illuminated by a high intensity xenon or like flash lamp 12 which is driven by a power supply 13. The supply 13 is conventional, and typically may cause the lamp 12 to flash once for each cycle of a 60 Hz ac power line frequency. In a typical application, the flash lamp 12 may be placed at about seven feet from the array 11. For an array 11 having an area of 2½ feet square, such an arrangement typically may provide illumination that is uniform over the entire array surface by better than about 2%. For an array 11 having a 5-foot square area, uniformity of better than 10% may be achieved with such an arrangement. Of course, the present invention is not limited to any particular flash lamp and array configuration, spacing or dimensions.

Figure 2:
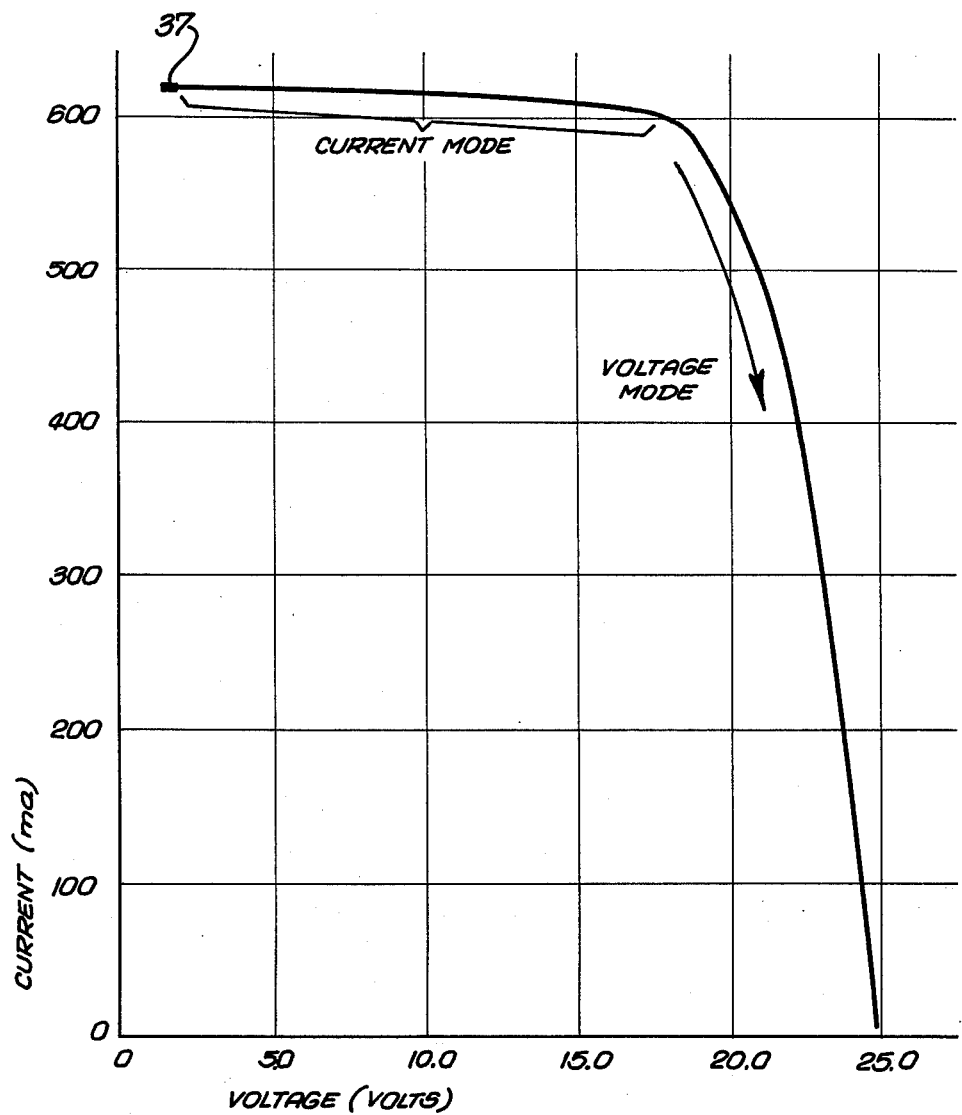
FIG. 2 is a plot of output current as a function of output voltage for a typical photovoltaic array; the plot is obtained using the inventive system of FIG. 1.

The system 10 typically employs a conventional X-Y plotter 14 to produce a plot of the array 11 current-voltage characteristics such as that shown in FIG. 2.

The illumination level at which the current-voltage characteristics are measured is established by a potentiometer 15 connected across a regulated dc voltage source connected to a terminal 16. The potentiometer 15 provides on a line 17 a reference voltage the level of which is indicated by a conventional digital or other voltmeter 18.

The illumination level striking the photovoltaic array 11 is detected by a photosensor 19 that is positioned adjacent to, and in the same plane as the array 11. The photosensor 19 output is amplified by an amplifier 20 and provided via a line 21 to a comparator 22. There the photosensor 19 output is compared with the reference level supplied from the potentiometer 15. As soon as the light level from the lamp 12 reaches the desired intensity, the amplified photosensor 19 output will reach and cross over the level of the reference signal on the line 17. When that occurs, the comparator 22 will provide an output signal on a line 23 which triggers a monostable multivibrator (one-shot) 24. This circuit will then provide a "SAMPLE" pulse on a line 25 that is used to gate measurement of the present output of the photovoltaic array 11.

In this manner, each sampled output of the array 11 is taken at the same, selected illumination level. For example, flash lamp 12 may provide a peak light output at the surface of the array 11 of about 125 mW/cm$^2$. The potentiometer 15 may be set to provide a reference voltage such that the "SAMPLE" pulse occurs when the output from the flash lamp 12 reaches say 100 mW/cm$^2$, as measured by the photosensor 19. Of course, this level will occur during the rise time of each flash of the lamp 12, and will be signaled by occurrence of the "SAMPLE" pulse from the one-shot 24.

The output voltage and current from the array 11 are sampled respectively by a pair of sample and hold circuits 27, 28 which are gated by the "SAMPLE" pulse on the line 25. The output terminals 29, 30 of the array 11 are connected to a nonlinear load circuit 31 and across a high resistance (typically 50 kohm) potentiometer 32 the tap of which is connected via a line 33 to the measurement input of the sample and hold circuit 27. In this manner, the potentiometer 32 serves to scale the sampled voltage that is supplied to the plotter 14.

The current from the array 11 is measured across a low resistance (typically 1 ohm) precision resistor 34 which is connected in series with a transistor 35 across the array terminals 29, 30. The junction 36 between the resistor 34 and the transistor 35 is connected to the measurement input of the sample and hold circuit 28. The sample and hold circuits 27 and 28 themselves are conventional, and each may comprise a commercially available integrated circuit sample and hold device such as the National Semiconductor type LH 0043.

The resistor 34 and the transistor 35 form the load for the array 11. When the transistor 35 is fully conducting, the effective resistance across the array 11 is at a minimum; this corresponds essentially to a short-circuit load condition under which the array 11 output current is a maximum and output voltage is a minimum. In the embodiment illustrated in FIG. 1, this corresponds to the start position 37 at which plotting of the FIG. 2 graph begins.

In accordance with the present invention, the conductivity of the transistor 35 gradually is reduced in nonlinear relationship to a RAMP signal provided on a line 38 from a ramp generator 39 driven by a clock 40.

Advantageously, the RAMP signal 38' (FIG. 1) begins at zero level, and goes in a negative direction in steps of equal voltage increment. This RAMP signal is provided to the non-inverting input of an operational amplifier 42 such as the National Semiconductor type LM 147 integrated circuit. The output 43 of the amplifier 42 is connected to the gate of a field effect transistor 44 that is connected in series with a resistor 45 across the emitter and collector of the transistor 35. The junction 46 between the FET 44 and the resistor 45 is connected to the base of the transistor 35. With this arrangement, the current flow through the FET 44 controls the extent of conductivity of the transistor 35.

A field effect transistor exhibits a nonlinear relationship between its gate voltage and its source-to-drain current. Thus, e.g. a change in gate voltage from zero volts to −1 volt will result in a greater decrease in source-to-drain current than will a like one volt change in gate voltage from −2 volts to −3 volts. This nonlinear FET characteristic is used to obtain a nonlinear relationship between the RAMP 38' steps to equal increment and the conductivity of the transistor 35 and hence the load resistance across the array 11 under test. By utilizing this nonlinear FER characteristic, the first several steps of the RAMP signal 38' result in a very gradual decrease in the conductivity of the transistor 35, beginning from the substantially full of condition. Thus these first steps implement the requisite slight change in the effective load resistance necessary to achieve accurate measurement and plotting of the array 11 output in the current mode. Thereafter, for the next succeeding steps of the RAMP signal 38', progressively larger incremental changes occur in the effective load resistance seen by the array 11, thereby facilitating accurate measurement in the voltage mode.

A Zener diode 47 is connected from the output of the amplifier 42 back to the inverting input thereof, and a resistor 48 is connected from this input to ground. These components effectively bias the output level of the amplifier 42 so that the first step of the RAMP signal 38' will just begin to pinch off the junction of the FET 44.

The ramp generator 39 is known per se. For example, it may consist of a binary counter that is incremented by the pulses from the clock 40, together with a digital-to-analog converter which converts the binary count in the counter to a corresponding dc level that begins at zero, and steps toward a negative voltage each time the counter is incremented. Although not shown, provision may be made to terminate measurement and plotting when the RAMP signal 38' reaches its ultimate value —V. At that time, a complete plot of the photovoltaic array 11 output (such as that shown in FIG. 2) has been obtained. The ramp generator may be reset in preparation for plotting the current-voltage characteristics of a different photovoltaic array 11, or of the same array but with a different light intensity selected by using the potentiometer 15.

Intending to claim all novel, useful and unobvious features, shown or described, the inventors make the following:

We claim:

1. A system for determining the current-voltage characteristics of a photovoltaic array, comprising:
   a flash lamp mounted to illuminate said photovoltaic array at a pulsed rate,
   a separate photosensor also mounted so as to be illuminated by said pulsed flash lamp,
   comparator means, connected to said photosensor, for providing a gate pulse each time that the illumination level striking said photosensor reaches a preselected level,
   nonlinear load means for providing successively different load impedance values across said photovoltaic array, and
   sampling means for sampling the current and voltage from said photovoltaic array at each of said successive load values, said sampling means being enabled by said gate pulse.

2. A system according to claim 1 wherein said load means comprises:
   a ramp generator for producing a ramp signal,
   a load element and a transistor connected together as a controllable load for said photovoltaic array, and
   control circuit means for conditioning the conductivity of said transistor in response to said ramp signal so that for relatively heavily conducting conditions of said transistor, said conductivity and hence the net impedance of said controllable load changes very slightly with each ramp step, thereby permitting the successive sampling of the photovoltaic array output at slightly different high current levels, and that for relatively lesser conductivity conditions of said transistor the net impedance of said controllable load changes more greatly for each ramp step, thereby permitting a larger current change for each ramp step.

3. A system according to claim 2 wherein said load element is a resistor connected in series with said transistor across said photovoltaic cell, and wherein said control circuit means comprises:
   a field effect transistor connected to the base of said transistor so as to control the conductivity thereof, said ramp voltage being used to control the gate voltage of said field effect transistor, so that the nonlinear relationship between the gate voltage and the source-to-drain current of said field effect transistor results in the desired nonlinear control function.

4. A system according to claim 1 wherein said nonlinear load means comprises:
   a. a first transistor and a low resistance resistor connected in series across the output of said photovoltaic array,
   a field effect transistor (FET) connected to provide base bias to said first transistor via the source-to-drain path of said FET, and
   a ramp generator connected to provide a ramp signal to the gate of said FET, whereby equal steps of said ramp signal result in unequal changes in the conductivity of said first transistor, and hence of the effective load across said array, as a result of the nonlinear relationship between gate voltage and source-to-drain current of a field effect transistor.

5. A system according to claim 4 wherein said sampling means comprises:
   a first sample and hold circuit connected to sample the voltage across the output of said photovoltaic array,
   a second sample and hold circuit connected to sample the voltage developed across said low resistance resistor, said developed voltage being indicative of the output current from said photovoltaic array, said gate pulse enabling both of said sample and hold circuits.

6. A system for determining the current-voltage characteristics of a photovoltaic array, comprising:
   a ramp generator producing a ramp signal,
   a first transistor connected in a load circuit across the output of said photovoltaic array, the conductivity of said first transistor thereby establishing the net load impedance for said array,
   a field effect transistor connected to provide base bias to said first transistor via the source-to-drain path of said field effect transistor, said ramp signal being provided to the gate of said field effect transistor, so that the net effective load impedance for said photovoltaic array changes in relatively small steps at near full conductivity of said first transistor and in relatively larger steps for lesser conductivity of said first transistor, this nonlinear change in net effective load impedance resulting from the nonlinear relationship between gate voltage and source-to-drain current in a field effect transistor.

7. A system according to claim 6 wherein said ramp generator produces a ramp signal having steps of substantially equal incremental value, together with an operational amplifier having its output connected to the gate of said field effect transistor, the output of said ramp generator being connected to the non-inverting input of said operational amplifier, and a Zener diode connected between the output of said operational amplifier and the inverting input thereof so that the gate of said field effect transistor is biased by the Zener diode feedback to a level at which pinch-off of the field effect transistor will begin within the first few steps of said ramp signal.

8. A system according to claim 6 wherein said photovoltaic array is illuminated by a pulsed flash lamp, together with:
a photosensor situated adjacent to said photovoltaic array so as to sense the light level incident on said array,
illumination intensity selection means for providing a reference signal corresponding to a desired light level at which said current-voltage characteristics are to be determined,
comparator means for comparing the output signal from said photosensor with said reference signal and for providing a "sample" pulse when these compared signals are equal, said "sample" pulse thereby occurring at each pulse of said flash lamp when the light level incident on said array is at the desired level, and
sample and hold circuitry, gated on by said "sample" pulse, for sampling and holding the current and voltage from said photovoltaic array.

9. A system according to claim 8 together with an X-Y plotter connected to said sample and hold circuitry so as to plot the values of current and voltage held thereby, said plotter thus producing a curve of the current-voltage characteristics of said photovoltaic array.

* * * * *

UNITED STATES PATENT AND TRADEMARK OFFICE
CERTIFICATE OF CORRECTION

PATENT NO. : 4,129,823
DATED : December 12, 1978
INVENTOR(S) : KEES VAN DER POOL, LOUIS S. ROSINSKI, JR. and
JOHANN B. BELLI It is certified that error appears in the above-identified patent and that said Letters Patent are hereby corrected as shown below:

Column 2, line 26, after "circuits;" begin a paragraph.

Column 4, line 61, "to" should be --of--;
line 64, "FER" should be --FET--;
line 67, "of" should be --on--.

Column 6, line 16, delete "a." (first occurrence).

Signed and Sealed this

Third Day of April 1979

[SEAL]

Attest:

RUTH C. MASON
Attesting Officer

DONALD W. BANNER
Commissioner of Patents and Trademarks